(12) United States Patent
Ono

(10) Patent No.: US 10,867,856 B2
(45) Date of Patent: Dec. 15, 2020

(54) SEMICONDUCTOR DEVICE AND METHOD OF MANUFACTURING THE SAME, AND ELECTRONIC APPARATUS

(71) Applicant: SONY SEMICONDUCTOR SOLUTIONS CORPORATION, Kanagawa (JP)

(72) Inventor: Shogo Ono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/313,664

(22) PCT Filed: Jun. 20, 2017

(86) PCT No.: PCT/JP2017/022678
§ 371 (c)(1),
(2) Date: Dec. 27, 2018

(87) PCT Pub. No.: WO2018/008389
PCT Pub. Date: Jan. 11, 2018

(65) Prior Publication Data
US 2019/0172750 A1 Jun. 6, 2019

(30) Foreign Application Priority Data
Jul. 4, 2016 (JP) ................................ 2016-132250

(51) Int. Cl.
*H01L 21/78* (2006.01)
*H01L 23/00* (2006.01)
(Continued)

(52) U.S. Cl.
CPC .......... *H01L 21/78* (2013.01); *H01L 21/6836* (2013.01); *H01L 23/562* (2013.01);
(Continued)

(58) Field of Classification Search
CPC .............. H01L 21/6836; H01L 23/562; H01L 21/78–786
See application file for complete search history.

(56) References Cited

U.S. PATENT DOCUMENTS

2012/0119354 A1* 5/2012 Tsai ...................... H01L 21/563
257/737
2014/0242756 A1* 8/2014 Xue ........................ H01L 21/78
438/113
(Continued)

FOREIGN PATENT DOCUMENTS

JP 07-302772 A 11/1995
JP 10-312980 A 11/1998
(Continued)

OTHER PUBLICATIONS

International Search Report and Written Opinion of PCT Application No. PCT/JP2017/022678, dated Aug. 29, 2017, 10 pages of ISRWO.

*Primary Examiner* — Changhyun Yi
(74) *Attorney, Agent, or Firm* — Chip Law Group

(57) ABSTRACT

The present technology relates to a semiconductor device and a method of manufacturing the semiconductor device that enable prevention of generation of tape scraps from the dicing tape during dicing, and an electronic apparatus. When a semiconductor substrate on which a protective film for protecting a circuit surface is formed is divided, dicing is performed so as to form a portion in which the section width of the semiconductor substrate differs from the section width of the protective film. The present technology can be applied to a wafer level CSP manufacturing process and the like, for example.

14 Claims, 13 Drawing Sheets

(51) Int. Cl.
  *H01L 21/683* (2006.01)
  *H01L 27/146* (2006.01)
(52) U.S. Cl.
  CPC .. *H01L 27/14632* (2013.01); *H01L 27/14687* (2013.01); *H01L 27/14685* (2013.01)

(56) References Cited

U.S. PATENT DOCUMENTS

| | | | | |
|---|---|---|---|---|
| 2015/0130055 | A1* | 5/2015 | Lin | H01L 23/49827 257/737 |
| 2016/0042997 | A1* | 2/2016 | Takahashi | H01L 21/6836 438/464 |
| 2017/0358537 | A1* | 12/2017 | Klingbeil | H01L 23/4827 |

FOREIGN PATENT DOCUMENTS

| | | |
|---|---|---|
| JP | 2004-119602 A | 4/2004 |
| JP | 2009-141017 A | 6/2009 |
| JP | 2012-028654 A | 2/2012 |
| JP | 2014-203920 A | 10/2014 |

\* cited by examiner

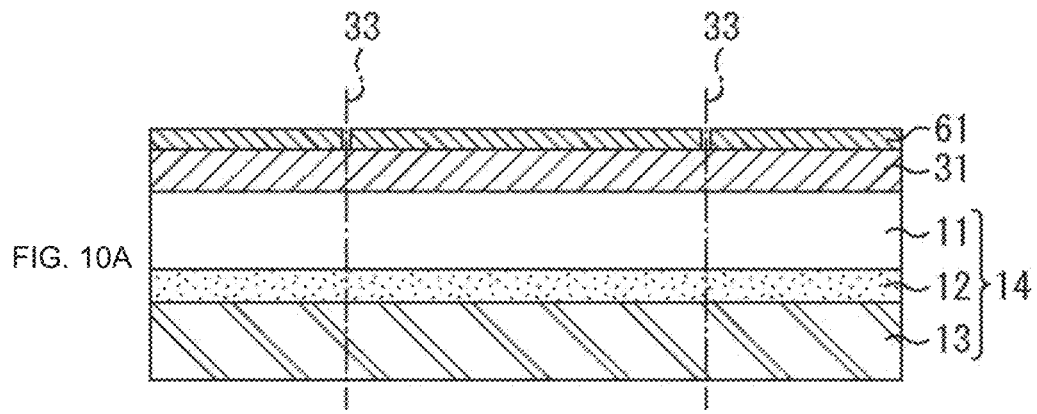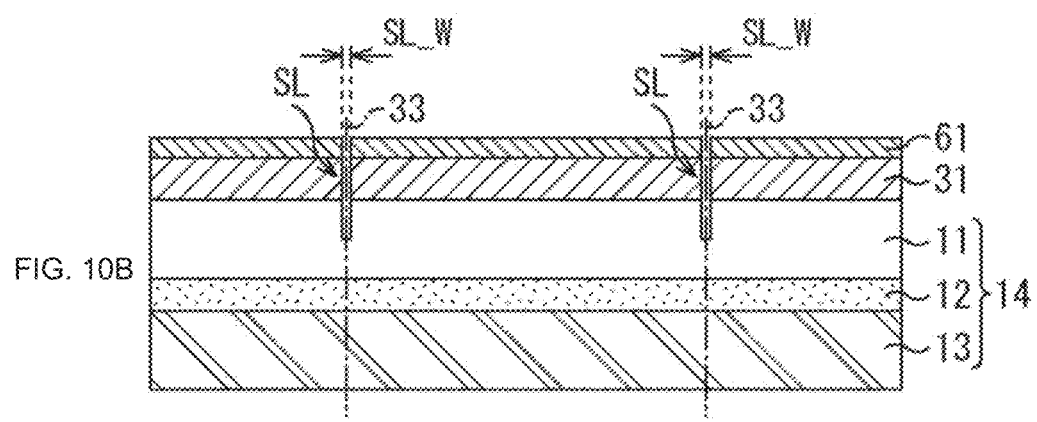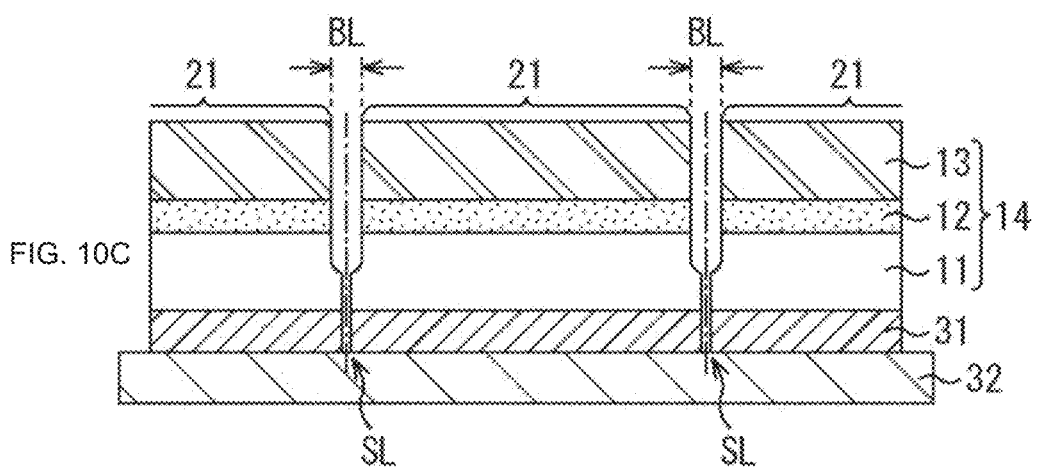

SEMICONDUCTOR DEVICE AND METHOD OF MANUFACTURING THE SAME, AND ELECTRONIC APPARATUS

CROSS REFERENCE TO RELATED APPLICATIONS

This application is a U.S. National Phase of International Patent Application No. PCT/JP2017/022678 filed on Jun. 20, 2017, which claims priority benefit of Japanese Patent Application No. JP 2016-132250 filed in the Japan Patent Office on Jul. 4, 2016. Each of the above-referenced applications is hereby incorporated herein by reference in its entirety.

TECHNICAL FIELD

The present technology relates to a semiconductor device and a method of manufacturing the semiconductor device, and an electronic apparatus. More particularly, the present technology relates to a semiconductor device and a method of manufacturing the semiconductor device that enable prevention of generation of tape scraps from the dicing tape during dicing, and an electronic apparatus.

BACKGROUND ART

In a wafer level chip size package (CSP), rewiring lines and terminals (electrode pads) are formed in a wafer, and the wafer level CSP is then divided into pieces of the chip size. Blade dicing for cutting a wafer into pieces of the chip size with a blade rotating at high speed is used for dividing a wafer into chips.

In blade dicing, as disclosed in Patent Document 1, a die bonding film and a semiconductor wafer are divided into pieces of the chip size with a blade, while the die bonding film and the semiconductor wafer are secured onto a dicing tape, for example.

CITATION LIST

Patent Document

Patent Document 1: Japanese Patent Application Laid-Open No. 2014-203920

SUMMARY OF THE INVENTION

Problems to be Solved by the Invention

However, both the dicing tape and the die bonding film are resin materials. Therefore, tape scraps generated from the dicing tape during the dicing are pulled up by the blade, and might adhere to the side surfaces of the die bonding film. The adhering tape scraps will later fall off and become the cause of a dust defect.

The present technology has been made in view of such circumstances, and aims to enable of prevention of generation of tape scraps from the dicing tape during dicing.

Solutions to Problems

A method of manufacturing a semiconductor device according to a first aspect of the present technology includes dividing a semiconductor substrate to cause the semiconductor substrate to have a different section width from a section width of a protective film for protecting a circuit surface when dividing the semiconductor substrate, the protective film being formed on the semiconductor substrate.

A semiconductor device according to a second aspect of the present technology includes a semiconductor substrate on which a protective film for protecting a circuit surface is formed, and has a portion in which a section width of the semiconductor substrate differs from a section width of the protective film.

An electronic apparatus according to a third aspect of the present technology includes a semiconductor device that includes a semiconductor substrate on which a protective film for protecting a circuit surface is formed, and has a portion in which a section width of the semiconductor substrate differs from a section width of the protective film.

In the first through third aspects of the present technology, there is a portion in which the section width of the semiconductor substrate on which the protective film for protecting the circuit surface is formed differs from the section width of the protective film.

The semiconductor device and the electronic apparatus may be independent devices, or may be modules to be incorporated into other apparatuses.

Effects of the Invention

According to the first through third aspects of the present technology, generation of tape scraps from the dicing tape during dicing can be prevented.

Note that effects of the present technology are not limited to the effects described herein, and may include any of the effects described in the present disclosure.

BRIEF DESCRIPTION OF DRAWINGS

FIGS. 10A, 10B, and 10C are diagrams for explaining a second method of forming the slits SL to a predetermined depth in the semiconductor substrate.

MODES FOR CARRYING OUT THE INVENTION

The following is descriptions of modes (hereinafter referred to as embodiments) for carrying out the present technology. Note that explanation will be made in the following order.

1. Outline of a process and problems of wafer level CSPs
2. First dicing method
3. Second dicing method
4. Outline of an example configuration of a solid-state imaging device <1. Outline of a Process and Problems of Wafer Level CSPs>

Figure 1:
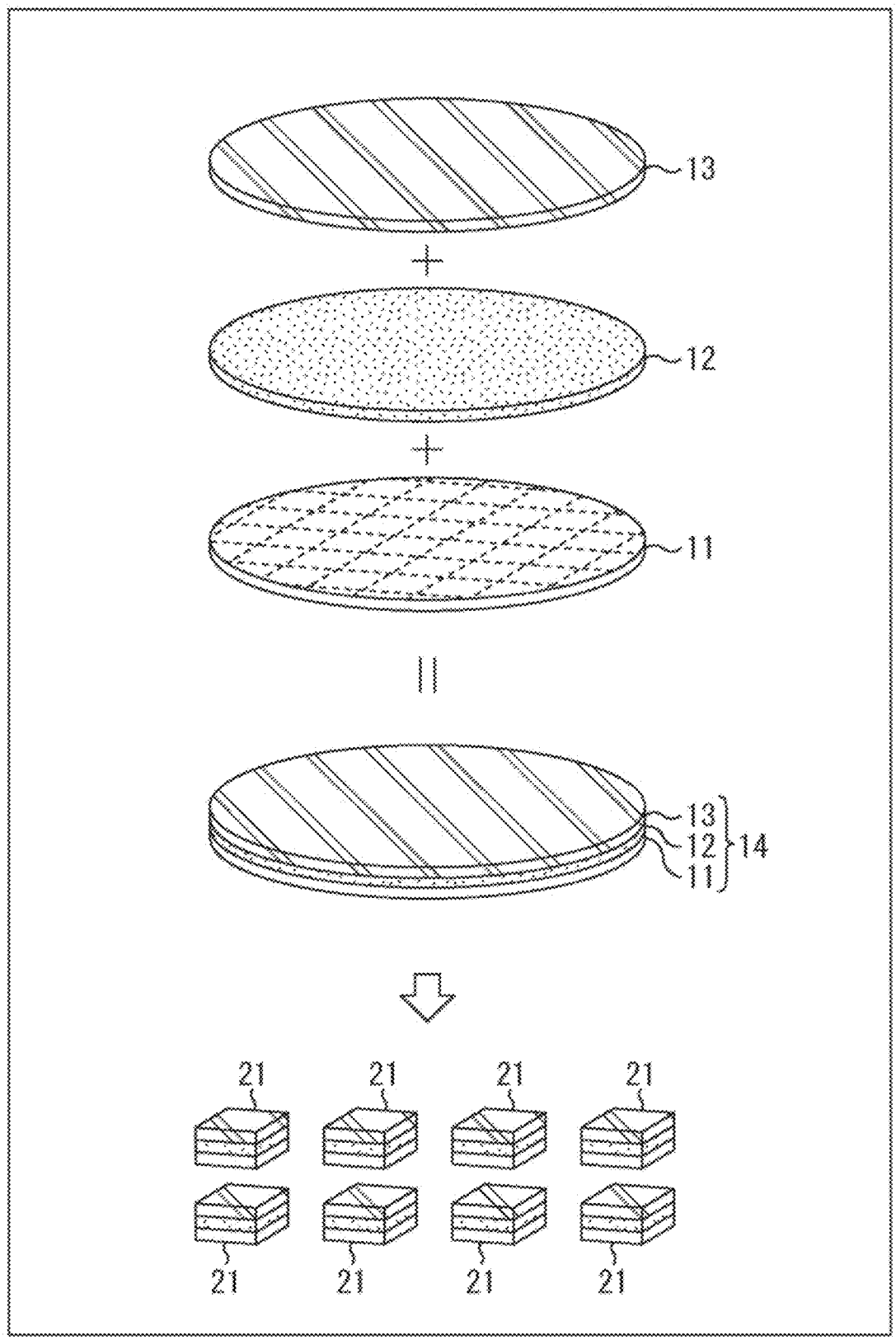
FIG. 1 is a diagram for explaining an outline of a process of semiconductor chips called wafer level CSPs.

FIG. 1 is a diagram for explaining an outline of a process of semiconductor chips (semiconductor devices) called wafer level CSPs.

As shown in FIG. 1, a glass stack wafer 14 is a semiconductor wafer formed by stacking a sealing resin 12 and a glass substrate 13 on a semiconductor substrate 11 in which a plurality of integrated circuits, rewiring lines, terminals (electrode pads), and the like are formed on a chip-by-chip basis, in a wafer form. The dashed lines on the semiconductor substrate 11 indicate the boundaries between the chips arranged in a matrix.

Semiconductor chips 21 called wafer level CSPs are manufactured by dividing the glass stack wafer 14 in a wafer form into pieces in the chip size.

Figure 2:
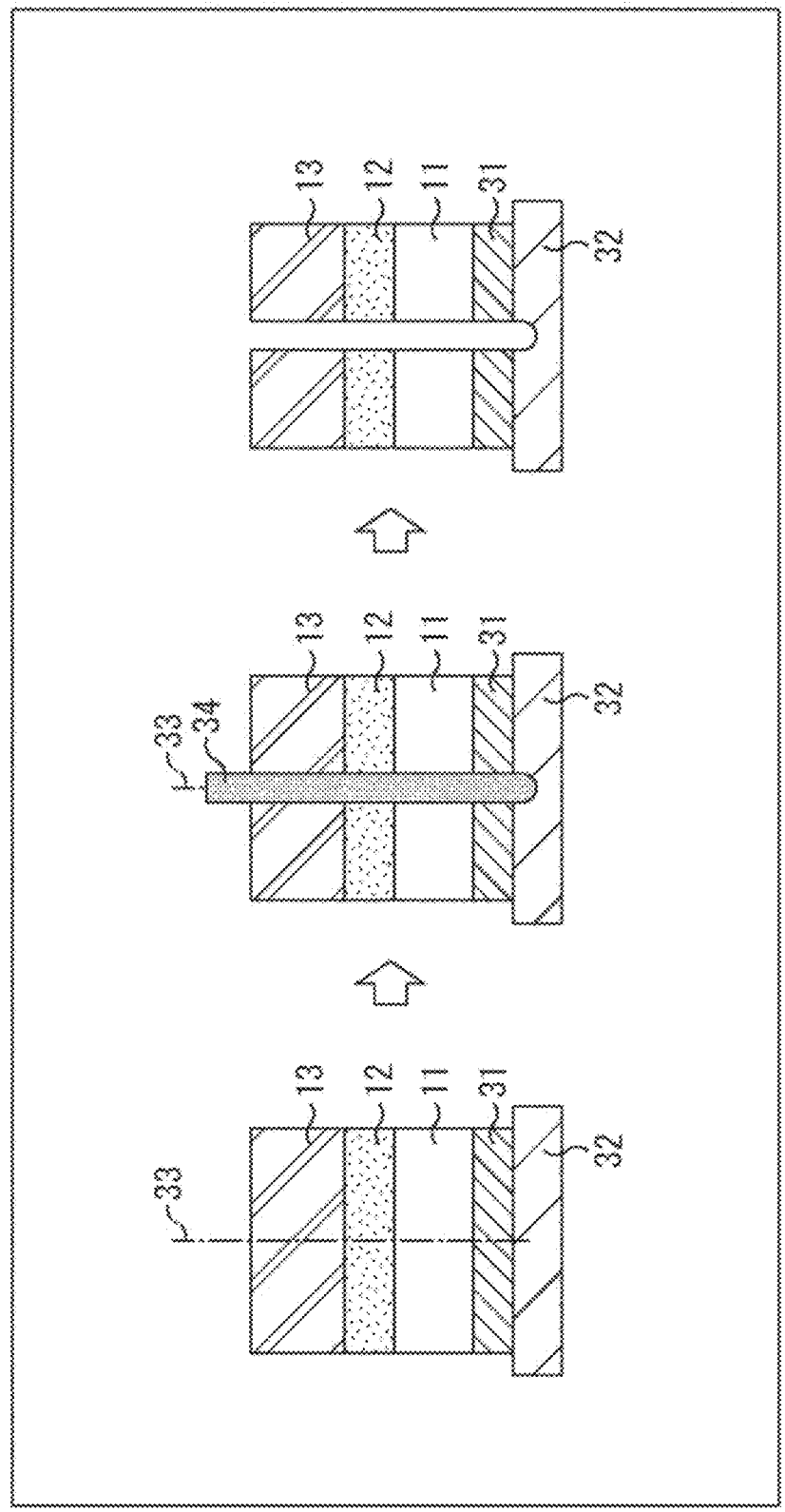
FIG. 2 is a diagram for explaining a conventional process of singulation.

In the chip dividing step, as shown in FIG. 2, for example, a dicing tape 32 is attached to the upper surface of a protective film 31 that protects the circuit surface of a rewiring layer or the like formed on the semiconductor substrate 11. After that, dicing along dicing lines 33 is performed with blades 34, so that the glass stack wafer 14 in the wafer form is divided into individual semiconductor chips 21. A dicing line 33 is a line corresponding to the central portion of a dicing street (a scribe line).

Figure 3:
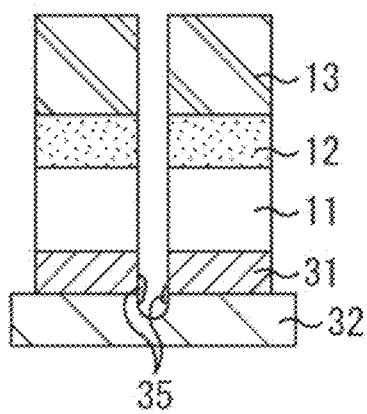
FIG. 3 is a diagram for explaining a dust defect caused by adhesion of tape scraps.

As a resin material is used for both the protective film 31 and the dicing tape 32, the tape scraps 35 of the dicing tape 32, which are generated when the dicing tape 32 is cut, might adhere to side surfaces of the protective film 31, as shown in FIG. 3. The tape scraps 35 adhering to the side surfaces of the protective film 31 will later fall off and become the cause of a dust defect. Therefore, there is a demand for a dicing method that does not generate the tape scraps 35.

In response to the demand, a dicing method that prevents generation of the tape scraps 35 will be described below. Note that, in the description below, components corresponding to those described with reference to FIGS. 1 through 3 are denoted by the same reference numerals as those used in FIGS. 1 through 3, and explanation of them is not unnecessarily repeated.

<2. First Dicing Method>

Referring now to FIGS. 4A, 4B, 4C, 5A, 5B, and 5C, a first dicing method to which the present technology is applied is described.

Figure 4A:
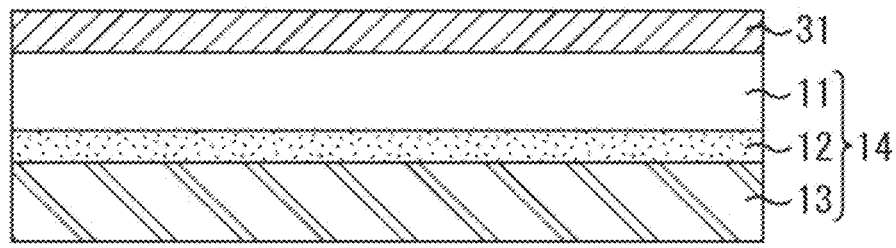
FIGS. 4A, 4B, and 4C are diagrams for explaining a first dicing method to which the present technology is applied.

First, as shown in FIG. 4A, a protective film 31 that protects the circuit surfaces of rewiring lines, terminals, and the like is formed, by a spin coating technique or the like, on the surface of the semiconductor substrate 11 of the glass stack wafer 14 on the opposite side from the side of the sealing resin 12. A resin material such as a photosensitive resist, for example, is used as the material of the protective film 31.

Figure 4B:
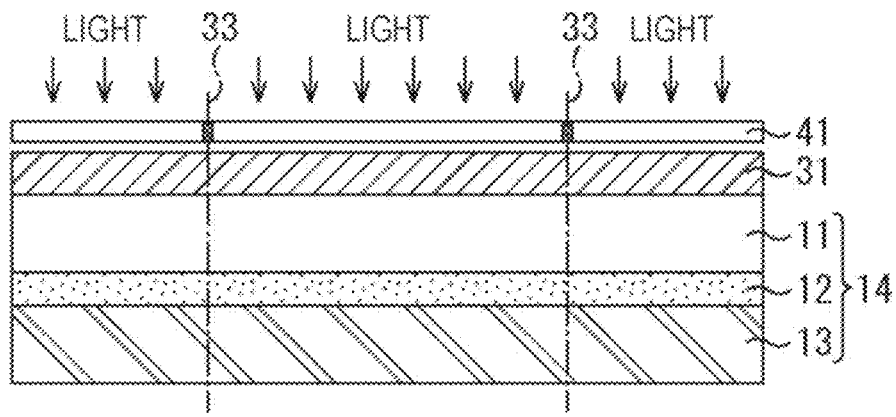

As shown in FIG. 4B, the protective film 31 is then exposed to light via a mask 41 in which regions of a predetermined width around dicing lines 33 are shielded from light.

Figure 4C:
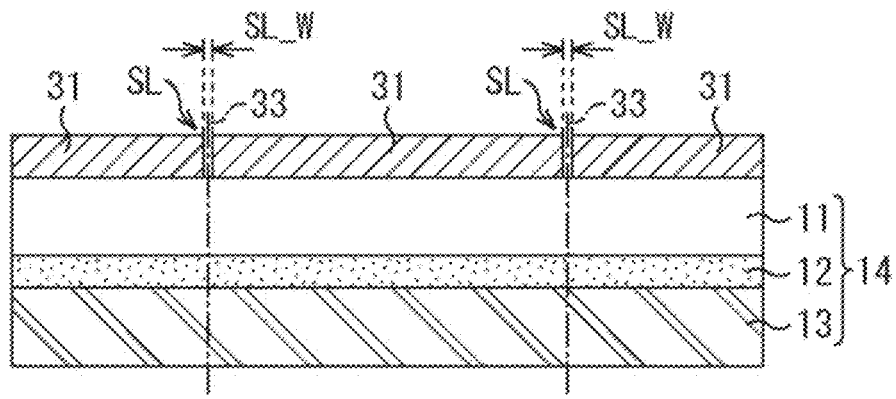

The protective film 31 in the regions exposed to the light passing through the mask 41 is cured, and the protective film 31 in the mask regions not exposed to the light is not cured. Therefore, as shown in FIG. 4C, slits SL having the predetermined width around the dicing lines 33 are formed in the protective film 31. The slits SL in a planar shape form the same lattice as the boundaries between the chips indicated by the dashed lines on the semiconductor substrate 11 in FIG. 1. The width SL_W of the slits SL is set at a smaller width than the cutting width of the blades 34 described later, or is set at about a width of 5 to 30 µm, for example.

Note that, in the slits SL shown in FIG. 4C, the protective film 31 is opened until the semiconductor substrate 11 is exposed, but part of the protective film 31 in contact with the semiconductor substrate 11 may be left. In other words, the depth of the slits SL may be formed to be a predetermined depth T2 (T2<T1) from the outermost surface, with respect to the entire thickness T1 of the protective film 31.

Figure 5A:
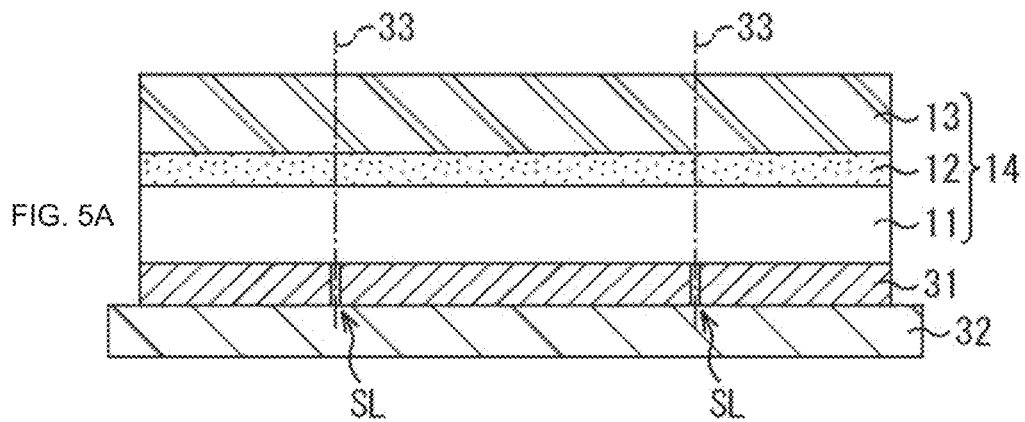
FIGS. 5A, 5B, and 5C are diagrams for explaining the first dicing method to which the present technology is applied.

Next, as shown in FIG. 5A, the dicing tape 32 is attached to the upper surface of the protective film 31 having the slits SL formed therein, and the entire glass stack wafer 14 is reversed.

Figure 5B:
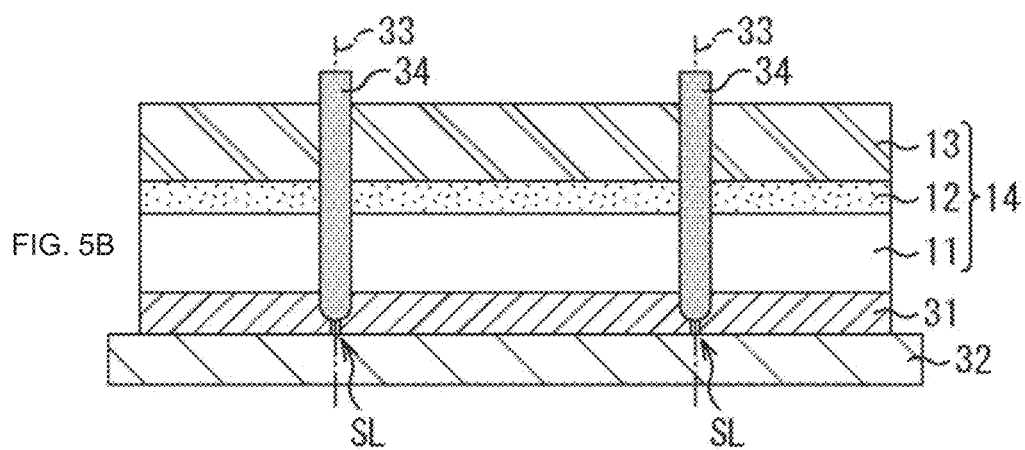

As shown in FIG. 5B, the depth (the blade height) of the blades 34 of the dicing device is then set at such a position that reaches the slits SL but does not reach the dicing tape 32, and cutting is performed along the dicing lines 33 in the planar direction.

Figure 5C:
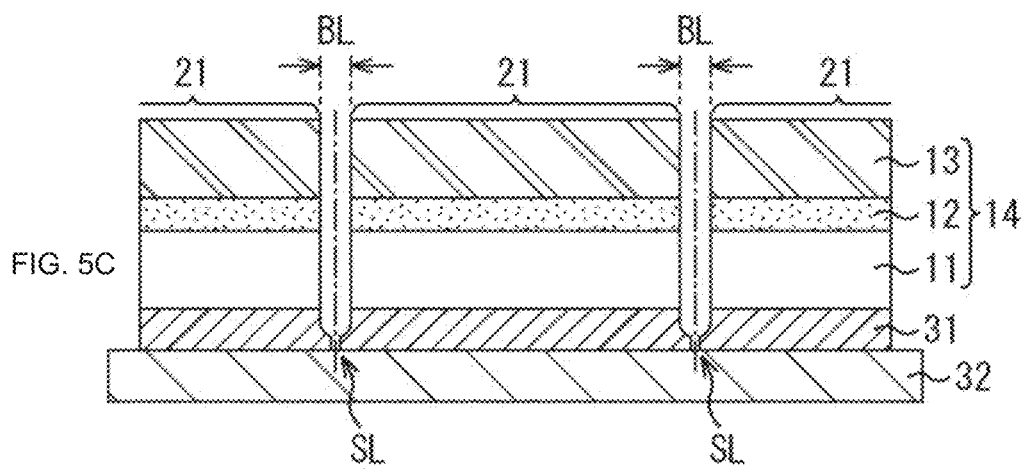

As a result of cutting at the position where the blades 34 reach the slits SL, the glass stack wafer 14 in the wafer form is divided into individual semiconductor chips 21, as shown in FIG. 5C. The blade width BL formed by the cutting with the blades 34 is about 35 to 60 µm, for example.

As described above, by the first dicing method, a photolithography technique is used, so that the slits SL are formed along the dicing lines with respect to the protective film 31 to which the dicing tape 32 is attached. After that, a dicing device cuts the semiconductor substrate 11 and the protective film 31 with the blades 34 until reaching the slits SL.

By the first dicing method, it is only required that the blades 34 do not reach the dicing tape 32, and cutting is performed to a depth that reaches the slits SL. Accordingly, the dicing tape 32 is not cut, and no tape scraps 35 of the dicing tape 32 are generated. Thus, generation of the tape scraps 35 from the dicing tape 32 during dicing can be prevented.

Figure 6:
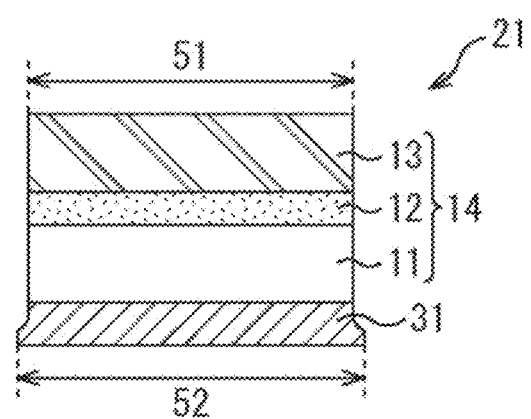
FIG. 6 is a schematic cross-sectional view of a semiconductor chip singulated by the first dicing method.

FIG. 6 is a schematic cross-sectional view of a semiconductor chip 21 singulated by the first dicing method.

The semiconductor chip 21 singulated by the first dicing method has a portion divided by slits SL and a portion divided by blades 34. Accordingly, the protective film 31 has a portion with a great section width and a portion with a small section width. As the portion with the small section width of the protective film 31 has the same width as the section width of the semiconductor substrate 11, the section width of the protective film 31 is partially greater than the section width of the semiconductor substrate 11.

<Modifications>

Figure 7A:
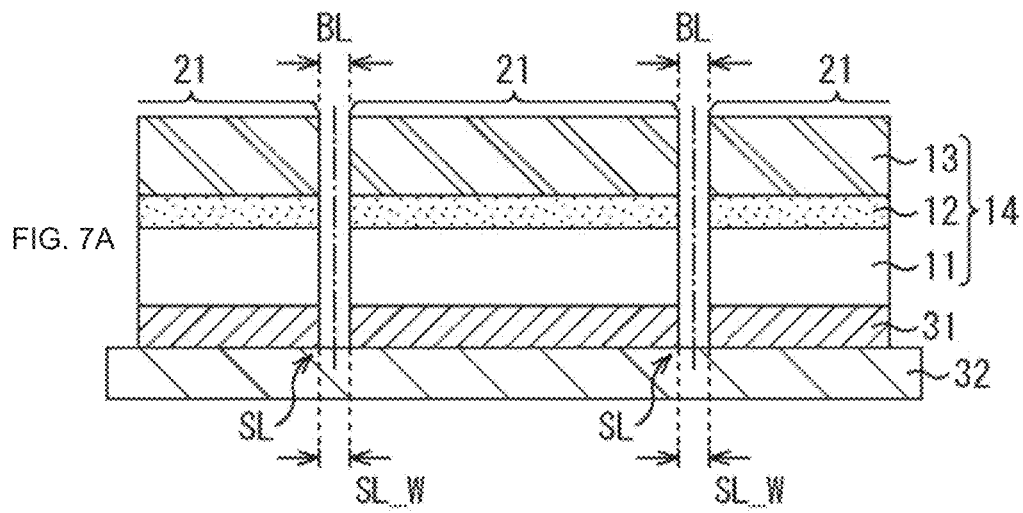
FIGS. 7A and 7B are diagrams showing modifications of the first dicing method.
Figure 7B:
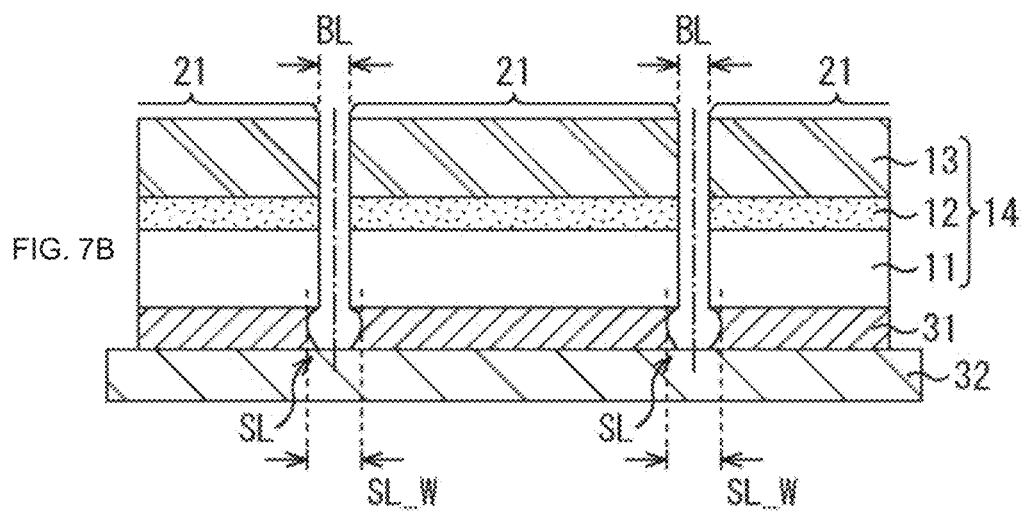

FIGS. 7A and 7B show modifications of the above described first dicing method.

By the above described first dicing method, there are a portion divided by the slits SL and a portion divided by the blades 34. Therefore, the protective film 31 has a portion with a great section width and a portion with a small section width.

In view of this, after the step of cutting along the dicing lines 33 with the blades 34 as shown in FIG. 5B, a step of removing the difference in width may be added, for example. In this step, wet etching is performed on the side surfaces of the slits SL of the protective film 31 so that the width SL_W of the slits SL becomes the same as the blade width BL as shown in FIG. 7A.

Alternatively, in the step of removing the difference in width, wet etching may be performed on the side surfaces of the slits SL of the protective film 31 so that the width SL_W of the slit SL of the protective film 31 becomes wider than the blade width BL as shown in FIG. 7B.

As described above, after the step of cutting with the blades 34, the width SL_W of the slits SL may be increased by wet etching.

<3. Second Dicing Method>

Next, a second dicing method to which the present technology is applied is described.

Figure 8:
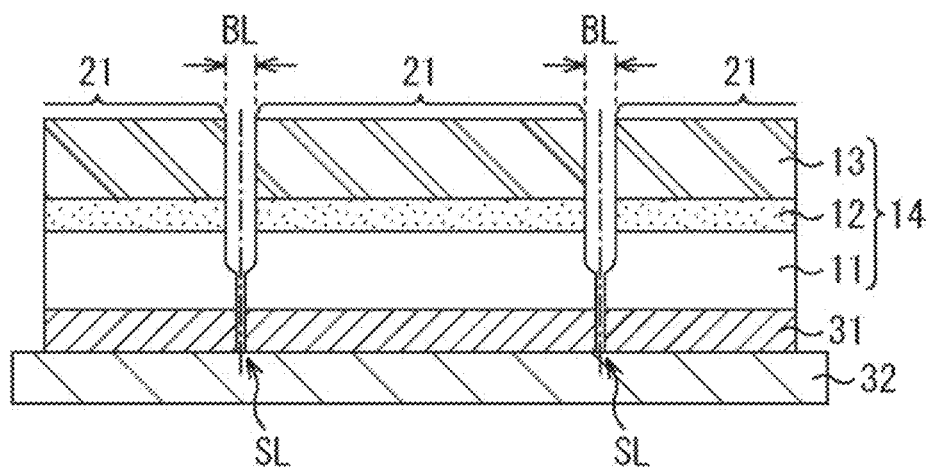
FIG. 8 is a diagram for explaining the outline of a second dicing method.

FIG. 8 is a diagram for explaining the outline of the second dicing method.

By the above described first dicing method, the portion in which the slits SL are formed is only in the layer of the protective film 31. By the second dicing method, on the other hand, slits SL are formed not only in the layer of the protective film 31 but to a predetermined depth in the semiconductor substrate 11, as shown in FIG. 8.

Two kinds of methods can be adopted as the method of forming the slits SL to a predetermined depth in the semiconductor substrate 11 as described above.

Figure 9A:
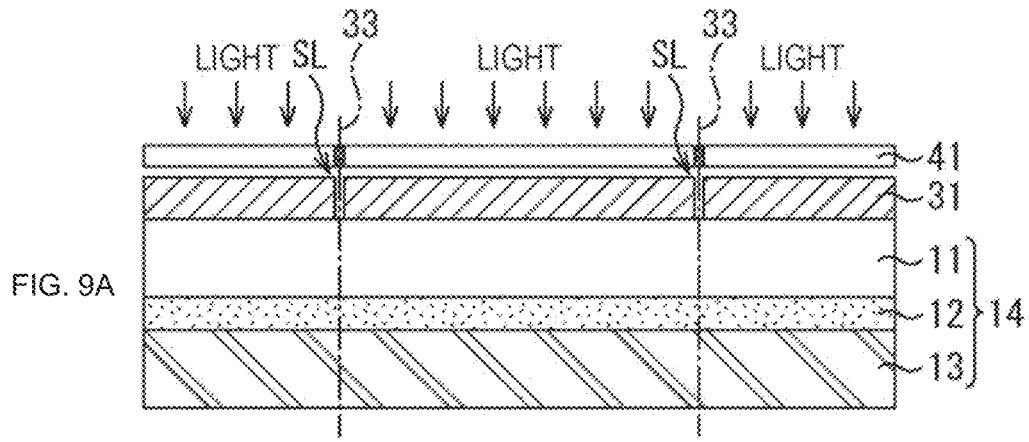
FIGS. 9A, 9B, and 9C are diagrams for explaining a first method of forming slits SL to a predetermined depth in a semiconductor substrate.
Figure 9B:
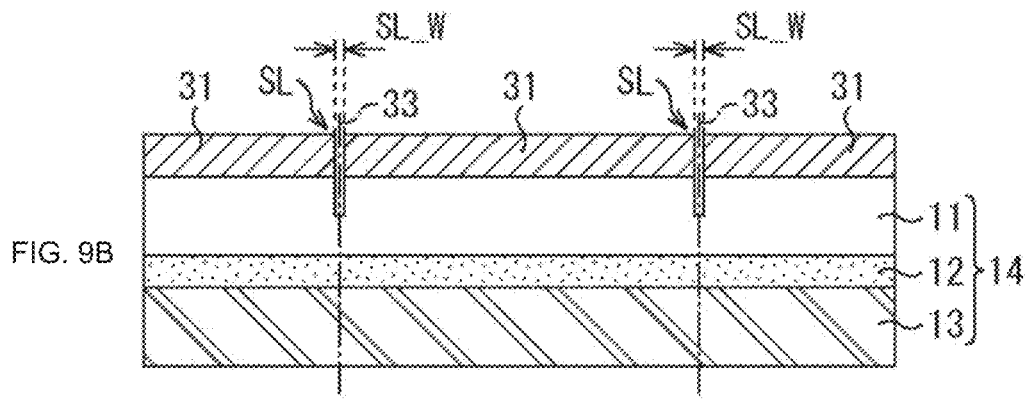
Figure 9C:
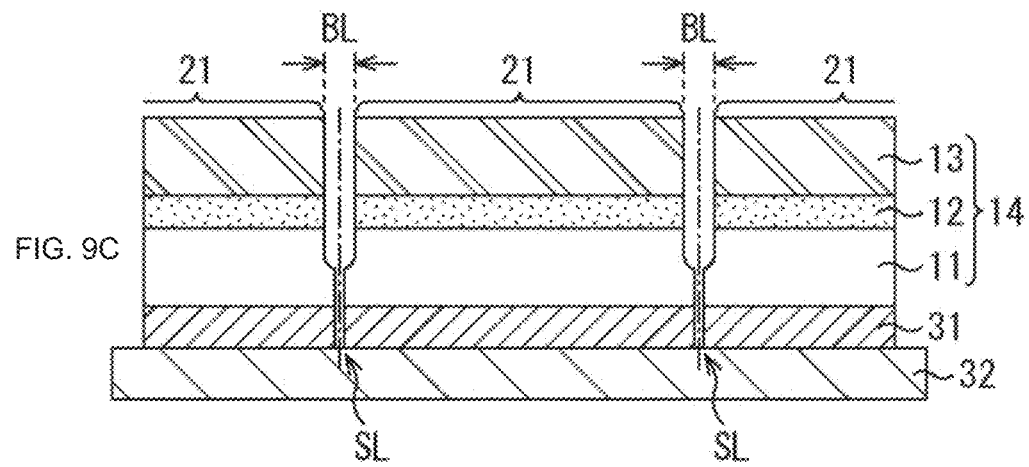

Referring now to FIGS. 9A, 9B, and 9C, a first method of forming the slits SL to a predetermined depth in the semiconductor substrate 11 is first described.

First, as shown in FIG. 9A, light is emitted onto the protective film 31 via the mask 41 in a manner similar to that shown in FIG. 4B of the first dicing method, so that slits SL are formed in predetermined regions around the dicing lines 33 on the protective film 31. The depth of the slits SL at this point is the same as the thickness of the protective film 31.

Next, as shown in FIG. 9B, the slits SL are further extended to a predetermined depth in the semiconductor substrate 11 by dry etching, the mask being the protective film 31 having the slits SL formed therein After that, as shown in FIG. 9C, the dicing tape 32 is attached to the upper surface of the protective film 31 having the slits SL formed therein, the entire glass stack wafer 14 is reversed, and the dicing device cuts the semiconductor substrate 11 with the blades 34 (not shown) at the blade height set at such a position that reaches the slits SL located closer than the dicing tape 32, in a manner similar to the first dicing method described above with reference to FIGS. 5A, 5B, and 5C. As a result, the glass stack wafer 14 in the wafer form is divided into individual semiconductor chips 21 as shown in FIG. 8.

Next, referring to FIGS. 10A, 10B, and 10C, a second method of forming the slits SL to a predetermined depth in the semiconductor substrate 11 is described.

First, as shown in FIG. 10A, the protective film 31 is formed on the surface of the semiconductor substrate 11 of the glass stack wafer 14 on the opposite side from the side of the sealing resin 12, and a resist 61 is applied onto the upper surface of the protective film 31. Patterning is then performed on the resist 61 so that regions of a predetermined width around the dicing lines 33 are opened.

Next, as shown in FIG. 10B, dry etching is performed to a predetermined depth in the semiconductor substrate 11, using the patterned resist 61 as a mask. As a result, the slits SL that penetrate the protective film 31 to reach the predetermined depth in the semiconductor substrate 11 are formed.

After that, as shown in FIG. 10C, the dicing tape 32 is attached to the upper surface of the protective film 31 having the slits SL formed therein, the entire glass stack wafer 14 is reversed, and the dicing device cuts the semiconductor substrate 11 with the blades 34 (not shown) at the blade height set at such a position that reaches the slits SL located closer than the dicing tape 32, in a manner similar to the first dicing method described above with reference to FIGS. 5A, 5B, and 5C. As a result, the glass stack wafer 14 in the wafer form is divided into individual semiconductor chips 21 as shown in FIG. 8.

As described above, by the second dicing method, a photolithography technique and dry etching are used, so that the slits SL are formed along the dicing lines in the protective film 31 to which the dicing tape 32 is attached and the semiconductor substrate 11. After that, a dicing device cuts the semiconductor substrate 11 with the blades 34 until reaching the slits SL. The surface of the semiconductor substrate 11 to be cut by the blades 34 is the surface on the opposite side from the surface in which the slits SL are formed.

Figure 11:
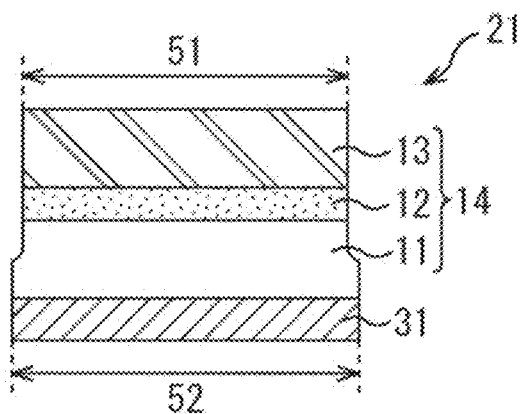
FIG. 11 is a schematic cross-sectional view of a semiconductor chip singulated by the second dicing method.

FIG. 11 is a schematic cross-sectional view of a semiconductor chip 21 singulated by the second dicing method.

The semiconductor chip 21 singulated by the second dicing method has a portion divided by slits SL and a portion divided by blades 34. Accordingly, the semiconductor substrate 11 has a portion with a great section width and a portion with a small section width. As the wider portion of the semiconductor substrate 11 has the same section width as the section width of the protective film 31, the section width of the semiconductor substrate 11 is partially smaller than the section width of the protective film 31.

Accordingly, in a case where the glass stack wafer 14 is divided by either the first dicing method or the second dicing method, the semiconductor chip 21 has a portion in which the section width of the semiconductor substrate 11 differs from the section width of the protective film 31.

<4. Outline of an Example Configuration of a Solid-State Imaging Device>

Figure 12:
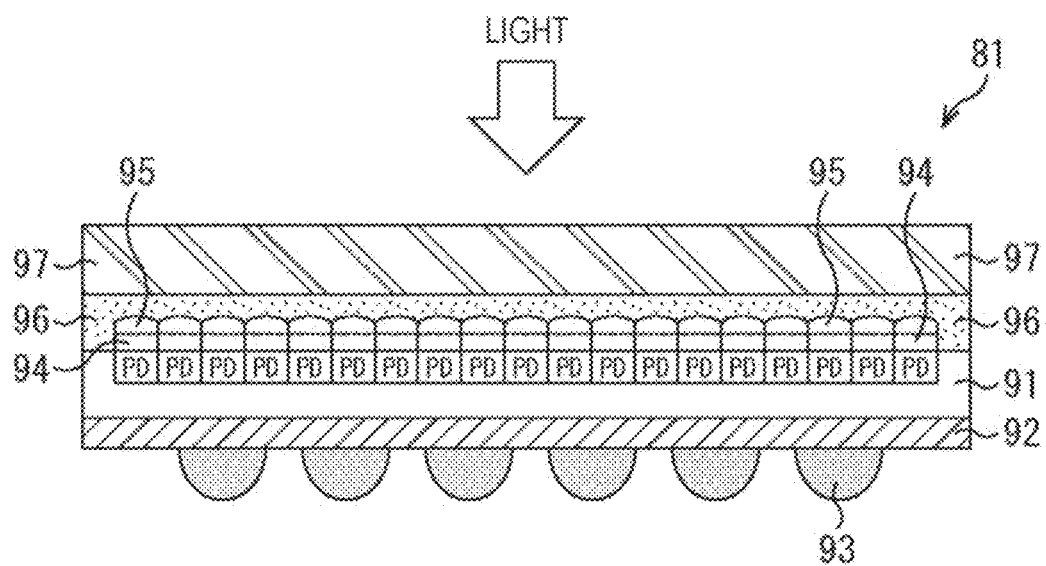
FIG. 12 is a diagram schematically showing a structure in a case where a singulated semiconductor chip is a solid-state imaging device.

FIG. 12 schematically shows a structure in a case where a semiconductor chip 21 singulated by the above described first or second dicing method is a solid-state imaging device.

A solid-state imaging device 81 as a semiconductor chip 21 converts light incident on the device in the direction indicated by an arrow in the drawing, into an electrical signal, and outputs the electrical signal from external terminals 93.

The solid-state imaging device 81 includes a semiconductor substrate 91 in which photodiodes PD for performing photoelectric conversion, a plurality of pixel transistors that control photoelectric conversion operations and operations of reading photoelectrically-converted electrical signals, and the like are formed on a pixel-by-pixel basis. Note that, in the description below, the side of the incidence surface through which light enters the solid-state imaging device 81 in FIG. 12 will be referred to as the upper side, and the side of the other surface on the opposite side from the incidence surface will be referred to as the lower side.

On the lower side of the semiconductor substrate 91, a protective film 92 that protects rewiring lines (not shown) and the like, and the external terminals 93 are formed. The external terminals 93 are solder balls, for example.

On the upper surface of the semiconductor substrate 91, color filters 94 of red (R), green (G), or blue (B), and on-chip lenses 95 are formed, for example. On the upper side of the on-chip lenses 95, a glass substrate 97 for protecting components in the solid-state imaging device 81, particularly the on-chip lenses 95 and the color filters 94, is disposed via a sealing resin 96.

In the solid-state imaging device 81 having the structure described above, the semiconductor substrate 91 corresponds to the above described semiconductor substrate 11, the sealing resin 96 corresponds to the sealing resin 12, and the glass substrate 97 corresponds to the glass substrate 13. Further, the protective film 92 corresponds to the protective film 31.

<Example Applications to Electronic Apparatuses>

The present technology is not necessarily applied to a solid-state imaging device. Specifically, the present technology can be applied to any electronic apparatus using a solid-state imaging device as an image capturing unit (a photoelectric conversion unit), such as an imaging apparatus like a digital still camera or a video camera, a mobile terminal device having an imaging function, or a copying machine using a solid-state imaging device as the image reader. A solid-state imaging device may be in the form of a single chip, or may be in the form of a module that is formed by packaging an imaging unit and a signal processing unit or an optical system, and has an imaging function.

Figure 13:
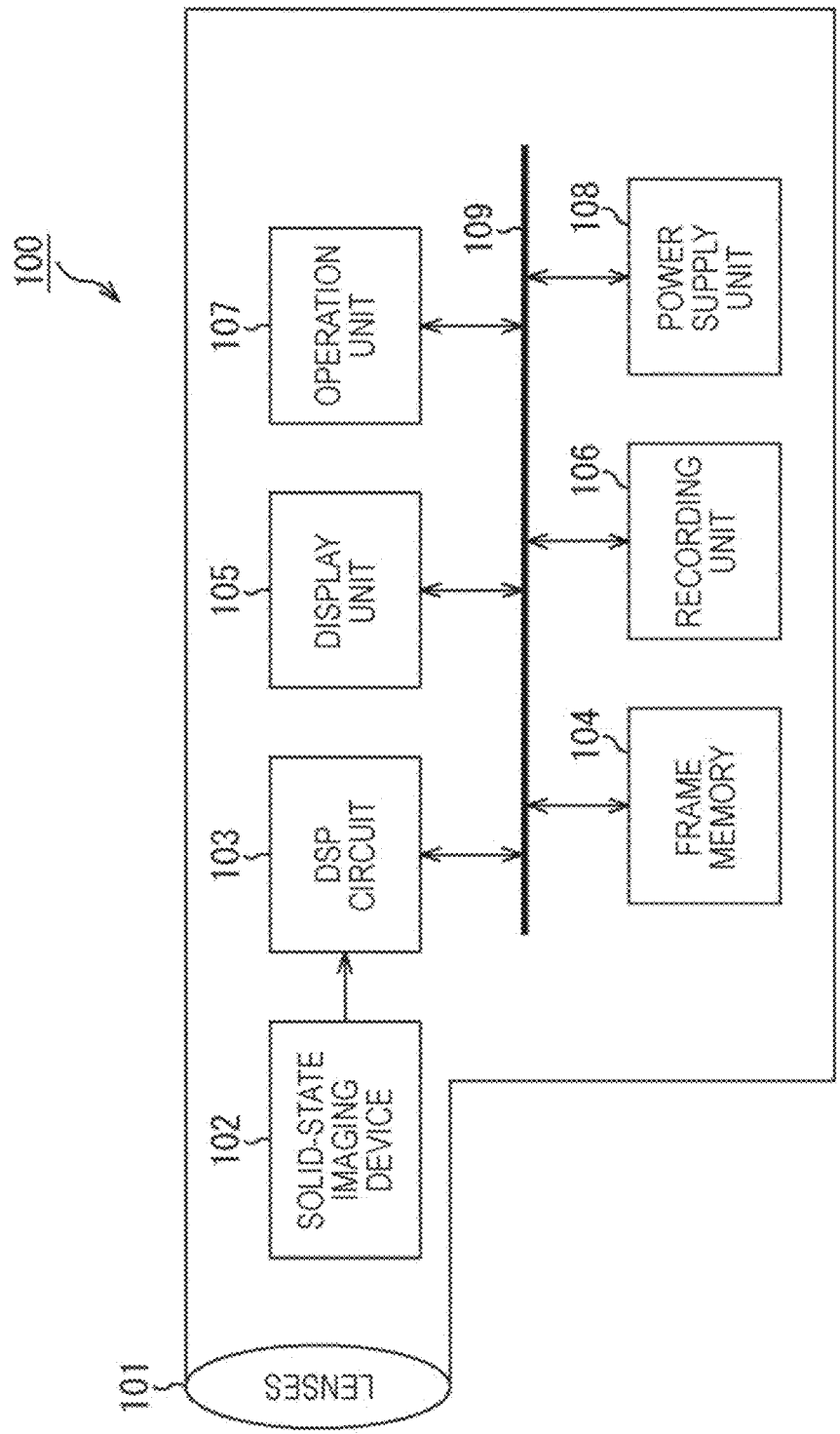
FIG. 13 is a block diagram showing an example configuration of an imaging apparatus as an electronic apparatus to which the present technology is applied.

FIG. 13 is a block diagram showing an example configuration of an imaging apparatus as an electronic apparatus to which the present technology is applied.

The imaging apparatus 100 shown in FIG. 13 includes an optical unit 101 formed with lenses and the like, a solid-state imaging device (an imaging device) 102 having the structure of the solid-state imaging device 81 (the semiconductor chip 21) shown in FIG. 12, and a digital signal processor (DSP) circuit 103 that is a camera signal processor circuit. The imaging apparatus 100 also includes a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are connected to one another via a bus line 109.

The optical unit 101 gathers incident light (image light) from an object and forms an image on the imaging surface of the solid-state imaging device 102. The solid-state imaging device 102 converts the amount of the incident light, which has been formed as the image on the imaging surface by the optical unit 101, into an electrical signal for each pixel, and outputs the electrical signal as a pixel signal. The solid-state imaging device 81 shown in FIG. 12, which is a solid-state imaging device manufactured by adopting the first or second dicing method that prevents generation of the tape scraps 35 can be used as the solid-state imaging device 102.

The display unit 105 is formed with a flat-panel display such as a liquid crystal display (LCD) or an organic electro-luminescence (EL) display, for example, and displays a moving image or a still image imaged by the solid-state imaging device 102. The recording unit 106 records the moving image or the still image imaged by the solid-state imaging device 102 on a recording medium such as a hard disk or a semiconductor memory.

When operated by a user, the operation unit 107 issues operating instructions as to various functions of the imaging apparatus 100. The power supply unit 108 supplies various power sources as the operation power sources for the DSP circuit 103, the frame memory 104, the display unit 105, the recording unit 106, and the operation unit 107, as appropriate.

<Examples of Use of an Image Sensor>

Figure 14:
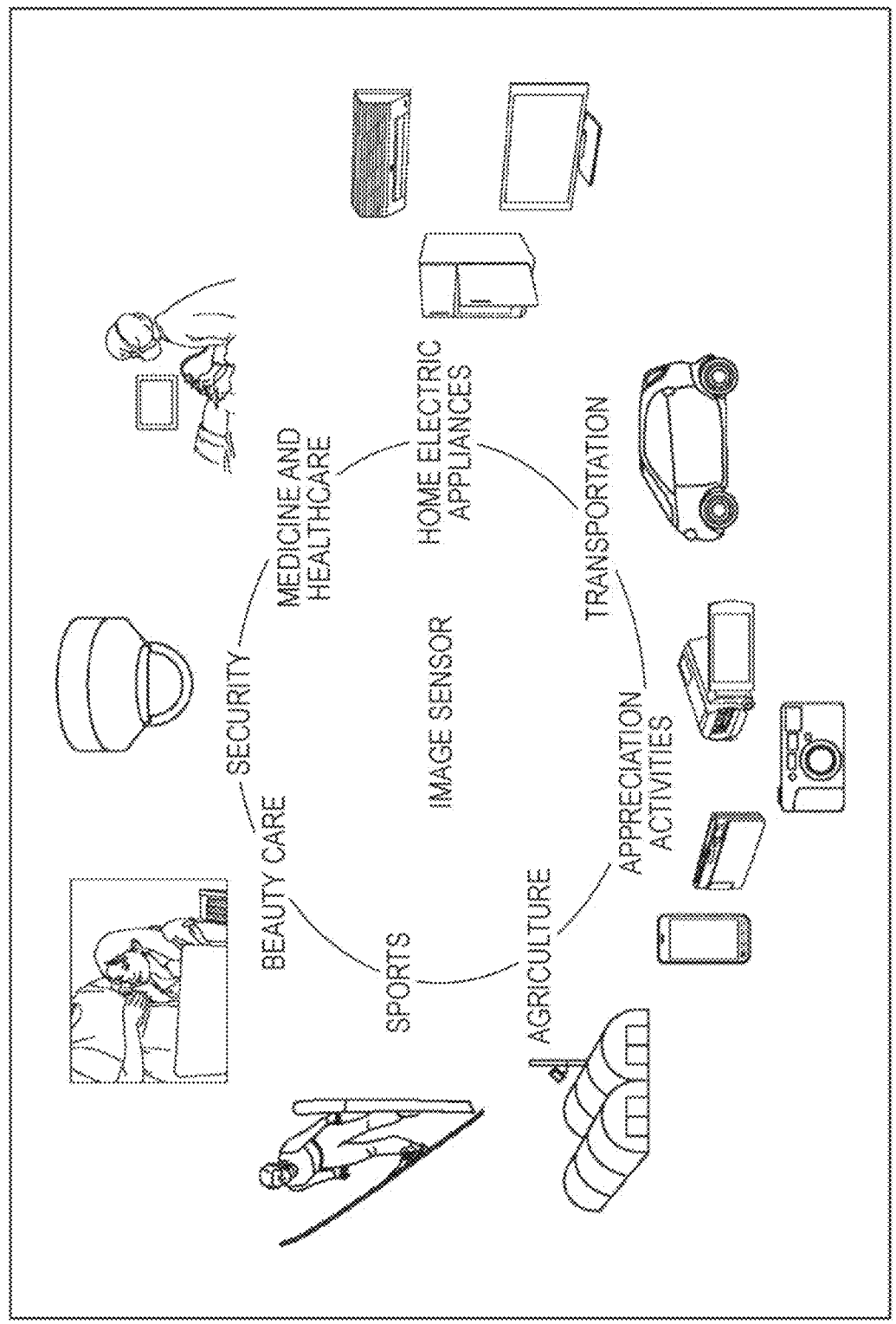
FIG. 14 is a diagram showing examples of use of an image sensor using a solid-state imaging device.

FIG. 14 is a diagram showing examples of use of an image sensor using the above described solid-state imaging device 81.

An image sensor using the above described solid-state imaging device 81 can be used in various cases where light, such as visible light, infrared light, ultraviolet light, or X-rays, is to be sensed, as listed below, for example.

- Devices configured to take images for appreciation activities, such as digital cameras and portable devices with camera functions.
- Devices for transportation use, such as vehicle-mounted sensors configured to take images of the front, the back, the surroundings, the inside, and the like of an automobile to perform safe driving such as an automatic stop and recognize the driver's condition and the like, surveillance cameras for monitoring running vehicles and roads, and ranging sensors for measuring distances between vehicles or the like.
- Devices to be used in conjunction with home electric appliances, such as television sets, refrigerators, and air conditioners, to take images of gestures of users and operate the appliances in accordance with the gestures.
- Devices for medical care use and health care use, such as endoscopes and devices for receiving infrared light for angiography.
- Devices for security use, such as surveillance cameras for crime prevention and cameras for personal authentication.
- Devices for beauty care use, such as skin measurement devices configured to image the skin and microscopes for imaging the scalp.
- Devices for sporting use, such as action cameras and wearable cameras for sports and the like.
- Devices for agricultural use such as cameras for monitoring conditions of fields and crops.

The present technology can also be applied not only to solid-state imaging devices that sense an incident light quantity distribution of visible light and capture an image, but also to solid-state imaging devices (physical quantity distribution sensors) in general, such as a solid-state imaging device that senses an incident quantity distribution of infrared rays, X-rays, particles, or the like and captures an image, or a fingerprint sensor that senses a distribution of some other physical quantity in a broad sense, such as pressure or capacitance and captures an image.

Further, the present technology can be applied not only to solid-state imaging devices but also to any semiconductor device having another semiconductor integrated circuit.

Embodiments of the present technology are not limited to the above described embodiments, and various modifications can be made to them without departing from the scope of the present technology.

Note that the advantageous effects described in this specification are merely examples, and the advantageous effects of the present technology are not limited to them and may include effects other than those described in this specification.

It should be noted that the present technology may also be embodied in the configurations described below.

(1)
A method of manufacturing a semiconductor device, including
dividing a semiconductor substrate to cause the semiconductor substrate to have a different section width from a section width of a protective film for protecting a circuit surface when dividing the semiconductor substrate, the protective film being formed on the semiconductor substrate.

(2)
The method of manufacturing a semiconductor device according to (1), in which, after a slit is formed along a dicing line in the protective film to which a dicing tape is attached, the semiconductor substrate is cut with a blade to a position that reaches the slit.

(3)
The method of manufacturing a semiconductor device according to (1), in which, after a slit is formed along a dicing line in the protective film to which a dicing tape is attached and the semiconductor substrate, the semiconductor substrate is cut with a blade to a position that reaches the slit.

(4)
The method of manufacturing a semiconductor device according to (3), in which a surface of the semiconductor substrate to be cut with the blade is a surface on an opposite side from a surface in which the slit is formed.

(5)
The method of manufacturing a semiconductor device according to any of (2) to (4), in which a width of the slit is smaller than a width to be cut away with the blade.

(6)
The method of manufacturing a semiconductor device according to any of (2) to (5), in which the slit is formed by a photolithography technique.

(7)
The method of manufacturing a semiconductor device according to any of (2) to (6), in which the slit is formed by dry etching.

(8)
The method of manufacturing a semiconductor device according to any of (2) to (7), in which, after the step of cutting with the blade, a width of the slit is increased by wet etching.

(9)
The method of manufacturing a semiconductor device according to (8), in which, after the step of cutting with the blade, the width of the slit is increased to the same width as a cutting width of the blade.

(10)
The method of manufacturing a semiconductor device according to (8), in which, after the step of cutting with the blade, the width of the slit is increased to a greater width than a cutting width of the blade.

(11)
The method of manufacturing a semiconductor device according to any of (1) to (10), in which the semiconductor device is a solid-state imaging device.

(12)
A semiconductor device including
a semiconductor substrate on which a protective film for protecting a circuit surface is formed,
in which there is a portion in which a section width of the semiconductor substrate differs from a section width of the protective film.

(13)
An electronic apparatus including
a semiconductor device including
a semiconductor substrate on which a protective film for protecting a circuit surface is formed,
in which there is a portion in which a section width of the semiconductor substrate differs from a section width of the protective film.

REFERENCE SIGNS LIST

11 Semiconductor substrate
12 Sealing resin
13 Glass substrate
14 Glass stack wafer
21 Semiconductor chip
31 Protective film
32 Dicing tape
33 Dicing line
34 Blade
81 Solid-state imaging device
91 Semiconductor substrate
92 Protective film
96 Sealing resin
97 Glass substrate
100 Imaging apparatus
102 Solid-state imaging device

The invention claimed is:

1. A method of manufacturing a semiconductor device, comprising:
forming a protective film on a semiconductor substrate; and
dividing the semiconductor substrate, wherein
a first section width of a first portion of the protective film is greater than a section width of the semiconductor substrate,
a second section width of a second portion of the protective film is smaller than the section width of the semiconductor substrate,
the first portion and the second portion of the protective film are on a same side of the semiconductor substrate,
the second portion of the protective film is closer to the semiconductor substrate than the first portion of the protective film, and
the protective film covers a circuit surface of the semiconductor device during the division of the semiconductor substrate.

2. The method of manufacturing the semiconductor device according to claim 1, further comprising:
forming a slit along a dicing line in the protective film, wherein a dicing tape is attached to the protective film; and
cutting the semiconductor substrate with a blade to a position that reaches the slit.

3. The method of manufacturing the semiconductor device according to claim 2, wherein a width of the slit is smaller than a width of the semiconductor substrate which is cut away with the blade.

4. The method of manufacturing the semiconductor device according to claim 2, further comprising
forming the slit by a photolithography technique.

5. The method of manufacturing the semiconductor device according to claim 2, further comprising
forming the slit by dry etching.

6. The method of manufacturing the semiconductor device according to claim 2, further comprising
increasing a width of the slit, by wet etching, after the cutting of the semiconductor substrate with the blade.

7. The method of manufacturing the semiconductor device according to claim 6, further comprising
increasing the width of the slit, to a width similar to a cutting width of the blade, after the cutting of the semiconductor substrate with the blade.

8. The method of manufacturing the semiconductor device according to claim 6, further comprising
increasing the width of the slit, to a width greater than a cutting width of the blade, after the cutting of the semiconductor substrate with the blade.

9. The method of manufacturing the semiconductor device according to claim 1, comprising:
forming a slit along a dicing line in the protective film and the semiconductor substrate, wherein a dicing tape is attached to the protective film, and
cutting the semiconductor substrate with a blade to a position that reaches the slit.

10. The method of manufacturing the semiconductor device according to claim 9, wherein
a first surface of the semiconductor substrate that is cut with the blade is on an opposite side of a second surface of the semiconductor substrate, and
the second surface of the semiconductor substrate includes the slit.

11. The method of manufacturing the semiconductor device according to claim 1, wherein the semiconductor device is a solid-state imaging device.

12. A semiconductor device, comprising:
a semiconductor substrate; and
a protective film on the semiconductor substrate, wherein
the protective film covers a circuit surface of the semiconductor device,
a first section width of a first portion of the protective film is greater than a section width of the semiconductor substrate,
a second section width of a second portion of the protective film is smaller than the section width of the semiconductor substrate,
the first portion and the second portion of the protective film are on a same side of the semiconductor substrate, and
the second portion of the protective film is closer to the semiconductor substrate than the first portion of the protective film.

13. An electronic apparatus, comprising:
a semiconductor device including:
a semiconductor substrate; and
a protective film on the semiconductor substrate, wherein
the protective film covers a circuit surface of the semiconductor device,
a first section width of a first portion of the protective film is greater than a section width of the semiconductor substrate,
a second section width of a second portion of the protective film is smaller than the section width of the semiconductor substrate,
the first portion and the second portion of the protective film are on a same side of the semiconductor substrate, and
the second portion of the protective film is closer to the semiconductor substrate than the first portion of the protective film.

14. A method of manufacturing a semiconductor device, comprising:
dividing a semiconductor substrate such that the semiconductor substrate has a section width different from a section width of a protective film;
forming the protective film on the semiconductor substrate, wherein the protective film covers a circuit surface of the semiconductor device during the division of the semiconductor substrate;
forming a slit along a dicing line in the protective film, wherein a dicing tape is attached to the protective film;
cutting the semiconductor substrate with a blade to a position that reaches the slit; and
increasing a width of the slit, by wet etching, after the cutting of the semiconductor substrate with the blade.

* * * * *